United States Patent [19]

Willson

[11] Patent Number: 4,627,728
[45] Date of Patent: Dec. 9, 1986

[54] COMPENSATED FABRY PEROT SENSOR

[75] Inventor: Jolyon P. Willson, London, England

[73] Assignee: International Standard Electric Corporation, New York, N.Y.

[21] Appl. No.: 584,204

[22] Filed: Feb. 27, 1984

[30] Foreign Application Priority Data

Mar. 16, 1983 [GB] United Kingdom ................. 8307241

[51] Int. Cl.$^4$ ............................................. G01B 9/02
[52] U.S. Cl. .................................... 356/345; 250/227; 356/352
[58] Field of Search ................. 356/345, 352; 250/227

[56] References Cited

U.S. PATENT DOCUMENTS 4,360,272 11/1982 Schmadel et al. .................. 356/352

OTHER PUBLICATIONS

Cielo, "Fiber Optic Hydrophone: Improved Strain Configuration and Environmental Noise Protection", Applied Optics, 18, No. 17, pp. 2933-2937, 9/79.
Koo et al., "Characteristics of Fiber-Optic Magnetic-Field Sensors Employing Metallic Glasses", Optics Letters, 7, No. 7, pp. 334-346, 7/82.

Primary Examiner—Davis L. Willis
Assistant Examiner—Matthew W. Koren
Attorney, Agent, or Firm—T. L. Peterson; J. S. Christopher

[57] ABSTRACT

A sensor responsive to magnetic field strength employs a feedback control loop operating on a piezoelectric stretcher element (13) to maintain a predetermined phase relationship between the optical path lengths of first and second Fabry Perot optical fiber/waveguide interferometer cavities (4, 11) optically in series. The control signal for the loop is derived from monitoring the transmission of the series combination and compensates for changes in optical path length in one of the cavities, the sensor cavity (4), induced by a magnetostrictive stretcher (7). The arrangement is responsive not only to the magnetic field but also to spurious effects resulting from temperature changes and so a reference cavity (5) thermally strapped to the sensor cavity is employed in a similar configuration to provided a second signal for correction purposes.

7 Claims, 3 Drawing Figures

COMPENSATED FABRY PEROT SENSOR

BACKGROUND OF THE INVENTION

The invention relates to Fabry Perot sensors generally and more specifically to such sensors in which the sensed parameter acts upon the sensor by changing the optical path length of a Fabry Perot cavity.

Interferometer instrumentation is known in the prior art for measurement of optical phase shift, precise wavelength, very small distances, thickness and for other known applications. In the present instance, the measurement of optical, magnetically-induced phase shift is contemplated using Fabry Perot interferometer concepts in a novel arrangement. The change can be detected by analyzing interference effects resulting from placing a first cavity optically in series with a second Fabry Perot cavity. For those interference effects to occur it is necessary for the two cavities to be of similar optical path length; that is to say the difference in their optical path length must be smaller than the coherence length of the light used to observe the interference.

Each cavity behaves much as a comb filter whose "teeth" represent narrow pass spaced apart in frequency (wavelength) by an amount dependent upon cavity length. The sharpness of the "teeth" depends upon the finesse of the cavity, which is a measure of its Q (quality factor) and is determined bgy the reflectivity of its end facets, the absorption losses associated with the medium between the facets and losses due to facet misalignment. If the optical path length of the first cavity differs from that of the second by a small integral number of half-wavelengths, the "teeth" of one comb will register (be congruent) with those of the other, with the result that light transmitted through one of the cavities will suffer little attenuation on passing through the second. Thus high transmission is associated with phase relationships of 0° and 180°. If however, the optical path length of either cavity changes by a small amount so that the phase relationship moves away from 0° or 180°, then the "teeth" of one comb become displaced from registry with those of the other, and the transmission rapidly falls away.

By arranging the relative optical path lengths of the two cavities such that the transmission of the combination is approximately 0.7 times its maximum value, a regime is established in which very small changes of relative phase produce relatively large changes in transmission. In principle, a particular change in transmission can be correlated with a particular change in phase, but this requires knowledge of the precise shape of the transfer function relating the two parameters. Hence, in a Fabry Perot sensor system, it is instead generally preferable to use a feedback system to maintain the relative phase of the two cavities by driving a stretcher acting on the optical path length of one of the cavities with an error signal derived from a detector measuring the transmission of the cavity combination.

The classical Fabry Perot cavity consists of two spaced apart plane parallel reflectors. For some applications the space between the reflecting facets contains air, while for certain critical work vacuum has been preferred so that the operation of the device will not be influenced by refractive index changes induced by changes of ambient temperature. The present invention concerns optical waveguide cavities in which the transmission medium between the reflecting facets is provided by an optical waveguiding structure which may, for instance, be an optical fiber of a waveguide channel defined in a slab of dielectric material. A device employing that type of waveguide cavity is described, for example, by S. J. Petuchowski et al. in an article entitled "A Sensitive Fiber-Optic Fabry Perot Interferometer" appearing in the *IEEE Journal of Quantum Electronics,* Vol. QE-17 No. 11, November, 1981 pp 2168-70.

An advantage of a waveguide cavity over the bulk optic equivalent is that the stringent requirement for the facets to be plane and parallel to avoid beam "walk-off" is greatly relaxed. This is because the light reflected from the facet will still be guided as long as it falls within the acceptance angle of the waveguide.

In addition, the waveguide cavity is inherently more robust as the facets are an integral part of the structure, and hence cannot be misaligned, which makes it particularly suited to sensor applications in hostile environments. With this type of cavity, the optical path length is dependent upon temperature, and hence there is a requirement either to ensure quite stringent temperature control or to take steps to quantify and compensate for errors resulting from temperature effects. The present invention is particularly concerned with the latter approach, and employs a reference cavity thermally strapped to the sensor cavity for the evaluation of temperature induced effects.

SUMMARY

According to the present invention there is provided a sensor with a first feedback control loop to maintain a predetermined phase relationship between the optical path length of a sensor waveguide Fabry Perot cavity and that of another waveguide Fabry Perot cavity of similar optical path length and optically in series with the sensor cavity, by controlling the optical path length of one of these two cavities while the optical path length of the sensor cavity is modulated by the sensed parameter. A second feedback control loop is provided to maintain a predetermined phase relationship between a reference waveguide Fabry Perot cavity, which is thermally strapped to the sensor cavity and is of similar construction and optical path length but is not modulated by the sensed parameter, and either the cavity optically in series with the sensor cavity or the further waveguide Fabry Perot cavity (which is thermally strapped to the cavity in series with the sensor cavity and is of similar construction and optical path length) by controlling the optical path length of the reference cavity or of the further cavity.

There follows a detailed destription of sensors embodying the invention in preferred forms, the description referring to the accompanying drawings.

DETAILED DESCRIPTION

Figure 1:
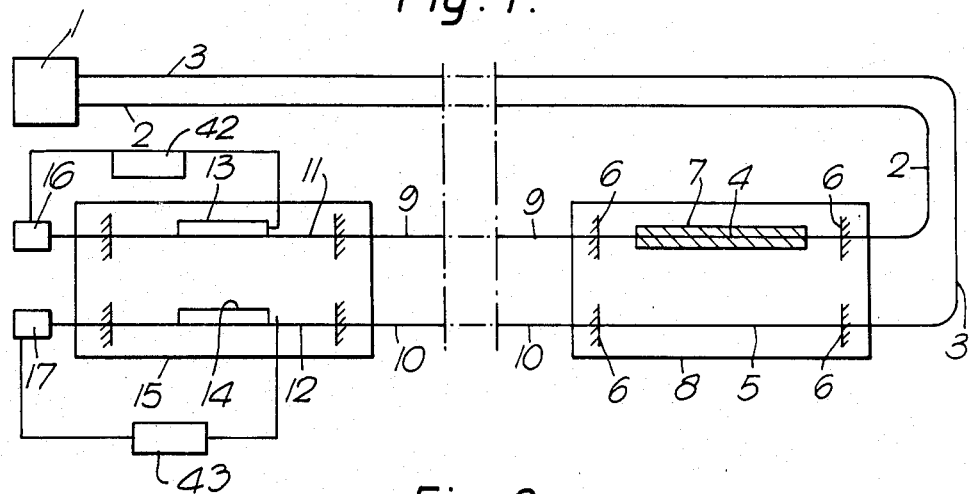
FIG. 1 schematically depicts a sensor in which the sensing optics are remote from the analyzing optics and the detector electronics.

Referring to FIG. 1, light from a source 1 (which may be a semiconductor laser diode operated just below threshold in order to provide a high brightness low divergence for coupling efficiently into single-mode fibers) is launched into two single-mode fibers 2 and 3 and directed to a remote station at which there are two waveguide Fabry Perot cavities 4 and 5 of similar optical path length defined by pairs of reflecting facets 6. A portion of the length of single-mode fiber defining the optical path length of cavity 4, which forms the sensor cavity, is coated with a layer 7 of magnetostrictive material. This material may be a metallic glass made (for example) of the alloy $Fe_{80}B_{20}$ to render the effective cavity length sensitive to changes in applied magnetic field. Cavities 4 and 5 are located side by side on a common substrate. This insures good thermal balance in that they are thermally strapped together to avoid temperature disparities between them.

Light emerging from these two cavities 4 and 5 is launched into two further single-mode fibers 9 and 10, which direct the light to a remote point at which there are two further cavities 11 and 12 of similar construction and optical path length vis-a-vis those of cavities 4 and 5. Cavity 11 is optically in series with the sensor cavity 4 and is provided with a piezoelectric stretcher 13 to modulate its optical path length. Similarly, cavity 12 is optically in series with the reference cavity 5 and is provided with a piezoelectric stretcher 14. The two cavities are mounted on a common substrate 15 designed to ensure that they are thermally strapped. Their optical outputs are fed to separate photodetectors 16 and 17, the output of photodetector 16 being used in a first feedback control loop 42 to bias stretcher 13 to maintain the optical path length of cavity 11 so that the photodetector output lies at a predetermined level approximately equal to 0.7 times the peak value corresponding to the maximum transmission of the tandem combination of cavities 4 and 11. Similarly, the output of photodetector 17 is used in a second feedback control loop 43 to bias stretcher 14 to maintain a similar output level from photodetector 17.

The sensor is calibrated under conditions of zero applied magnetic field to provide feedback control signals $S_o$ and $s_o$ pertaining respectively to the sensor control loop of photodetector 16 and the reference control loop of photodetector 17. Subsequently, in the presence of a magnetic field, the feedback control signals are $S_1$ and $s_1$, where, as a result of temperature changes, $s_1$ will not in general be equal to $s_o$. Assuming linear transfer characteristics for the changes in optical path length induced magnetostrictively and piezoelectrically, it follows that the magnitude of the applied magnetic field is proportioned to $(S_1-S_o)-(s_1-s_o)$.

Figure 2:
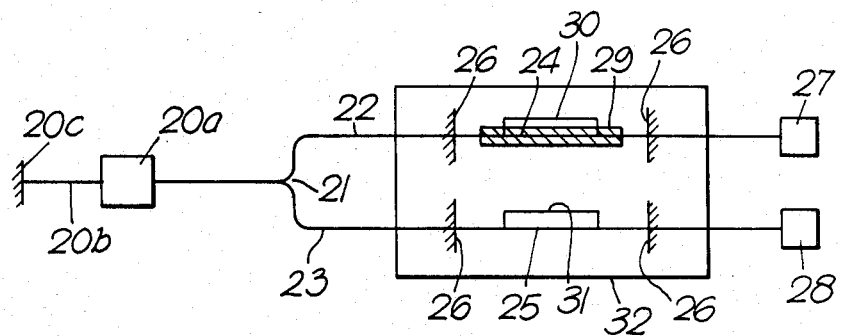
FIG. 2 schematically depicts a sensor in which the sensing optics are in proximity to the detecting optics.

The sensor of FIG. 1 employs four cavities but, by arranging for the sensor cavity also to have a piezoelectric stretcher, it is possible for the sensor and reference cavities to be separately in optical series with a common further cavity. This further cavity may itself form the optical source of the system, being provided by a single-mode laser. Such an arrangement is depicted in FIG. 2. The output of a single-mode laser 20 feeds a 3 dB coupler branching network 21 launching light into two single-mode optical fibers 22 and 23, which are coupled respectively with sensor and reference cavities 24 and 25 respectively defined by pairs of reflecting facets 26. Light emerging from these cavities is directed respectively on to photodetectors 27 and 28. The transmission medium of cavity 24 is provided with a magnetostrictive coating 29 and a piezoelectric stretcher 30, while that of cavity 25 is provided with a piezoelectric stretcher 31.

The two cavities 24 and 25 are thermally strapped together on a common substrate 32. Feedback control loops (not shown) link the output of photodetector 27 to stretcher 30, and that of photodetector 28 to stretcher 31, to act in the same way as the corresponding feedback control loops of the sensor of FIG. 1.

The laser 20 must have an extended cavity which is of similar optical length to that of the cavities 24 and 25, and this may be provided by a semiconductor laser chip 20a of conventional length which is coupled with an antireflection coupling to a length of waveguide 20b terminating in a highly reflecting facet 20c.

Figure 3:
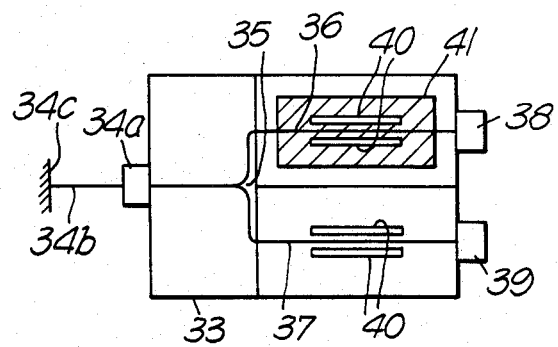
FIG. 3 schematically depicts an integrated optics version of the sensor of FIG. 2.

FIG. 3 depicts an integrated optics implementation of a sensor operating according to the same general principles as those of the sensor of FIG. 2. In this instance, an integrated optics waveguide pattern is formed in piezoelectric dielectric substrate 33, typically of lithium niobate material. A single-mode laser 34 feeds a branching waveguide 35, which in turn feeds a pair of Fabry Perot waveguide cavities 36 and 37 whose outputs are coupled to photodetectors 38 and 39. Both cavities are provided with bias electrodes 40 by which their optical path lengths can be stretched. Cavity 36 is covered with a magnetostrictive film 41 which may be of metallic glass to render it sensitive to applied magnetic fields. Feedback control loops (not shown) are provided in the same way and for the same purpose as employed in the sensors of FIGS. 1 and 2. The laser 34 also needs to have an extended cavity so that it shall be of similar optical length to that of cavities 36 and 37, and so like the laser 20 of FIG. 2 is constructed of three parts comprising a semiconductor chip 34a, a length of waveguide 34b and a highly reflecting facet 34c, with reflection at the waveguide chip interface being suppressed.

What is claimed is:

1. A sensor system responsive to an independent sensed parameter to be evaluated, said system including first and second waveguide Fabry Perot cavities, said first cavity being the sensor cavity, said first and second cavities having similar optical path lengths and being optically in series, a first feedback control loop for monitoring the transmission of the series combination of said first and second cavities and being operatively coupled to one of said first and second cavities to maintain a predetermined phase relationship between said optical path lengths of said first and second Fabry Perot cavities by controlling the path length of said first cavity while the optical path length of said first cavity is modulated by said sensed parameter, comprising:

a reference waveguide Fabry Perot cavity thermally strapped to one of said first and second cavities and being of equivalent construction and optical path length vis-a-vis the associated one of said first and second cavities; and a second feedback control loop for monitoring, at least in part, the transmission of said reference cavity and being operatively coupled to one of said second and reference cavities for maintaining a predetermined phase relationship between said reference cavity and one of said first and second cavities, by controlling the optical path length of one of said reference cavities or said second cavity.

2. A sensor as claimed in claim 1, wherein said sensed parameter is magnetic field strength and the optical path length of said first cavity includes a magnetostrictive element modulated by said field.

3. A sensor as claimed in claim 2, wherein said magnetostrictive element is a metallic glass layer applied to said first cavity waveguide transmission medium.

4. A sensor system as claimed in claim 1, wherein said first feedback control loop controls the optical path length of the one of said cavities optically in series with said first cavity.

5. A sensor system as claimed in claim 1, wherein said first feedback control loop is arranged to control the optical path length of said first cavity.

6. A sensor system as claimed in claim 5, wherein said reference cavity is optically in series with the one of said cavities optically in series with said first cavity.

7. A sensor system as claimed in claim 6, wherein said cavity optically in series with both said first and said reference cavities is the cavity of a single-mode laser.

* * * * *